United States Patent [19]

Schneller et al.

[11] Patent Number: 4,910,119

[45] Date of Patent: Mar. 20, 1990

[54] POLYMERIC COMPOUNDS AND RADIATION-SENSITIVE MIXTURE CONTAINING THEM

[75] Inventors: Arnold Schneller, Mainz; Juergen Sander, Liederbach, both of Fed. Rep. of Germany

[73] Assignee: Hoechst Aktiengesellschaft, Frankfurt am Main, Fed. Rep. of Germany

[21] Appl. No.: 246,034

[22] Filed: Sep. 15, 1988

Related U.S. Application Data

[63] Continuation of Ser. No. 896,250, Aug. 13, 1986, abandoned.

[30] Foreign Application Priority Data

Aug. 13, 1985 [DE] Fed. Rep. of Germany ....... 3528930

[51] Int. Cl.$^4$ .................. G03C 1/495; G03C 1/52; G03C 5/16
[52] U.S. Cl. .................. 430/192; 430/270; 430/326; 430/196; 430/175; 526/259; 526/265; 526/256; 526/284; 526/292.2; 526/292.3; 526/298; 526/313
[58] Field of Search ............ 430/270, 326, 196, 175, 430/192; 526/259, 265, 256, 284, 292.2, 292.3, 298, 313

[56] References Cited

U.S. PATENT DOCUMENTS 3,869,282 3/1975 Peters .......................... 96/115 R
4,025,710 5/1977 Stolka et al. ................. 526/284

FOREIGN PATENT DOCUMENTS 0000496 2/1979 European Pat. Off. .
0001803 5/1979 European Pat. Off. .
0126397 11/1984 European Pat. Off. .
1119667 7/1974 United Kingdom .

*Primary Examiner*—Paul R. Michl
*Assistant Examiner*—Cynthia Hamilton
*Attorney, Agent, or Firm*—Foley & Lardner, Schwartz, Jeffery, Schwaab, Mack, Blumenthal & Evans

[57] ABSTRACT

New polymers comprising repeat units represented by the formula

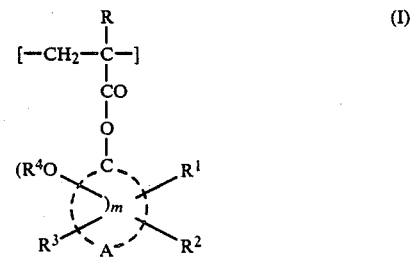

where
R is a hydrogen or a halogen atom, a cyanide group or an alkyl group,
R1, R2 and R3 are identical or different, and each denotes a hydrogen or a halogen atom, an alkyl group, an alkoxy group or an alkoxycarbonyl group,
R4 is a hydrogen atom or a divalent radical,
A denotes the atoms required for completing a mononuclear or dinuclear aromatic ring-system and
m is 2 or 3, are used as binders in positive-working, radiation-sensitive recording materials.

8 Claims, No Drawings

POLYMERIC COMPOUNDS AND RADIATION-SENSITIVE MIXTURE CONTAINING THEM

This application is a continuation, of application Ser. No. 896,250, filed Aug. 13, 1986, now abandoned.

BACKGROUND OF THE INVENTION

The present invention relates to new water-insoluble polymeric compounds which are soluble in aqueous alkaline solutions and which are suitable for use as binders for radiation-sensitive mixtures, in particular for the preparation of photoresist stencils and printing plates.

The polymers according to the present invention are particularly suitable for use in positive working radiation- or light-sensitive mixtures based on 1,2-naphthoquinonediazides, and in combinations of photolytically activatable acid donors with acid cleavable compounds. They are also suitable, however, for use as binders for negative working radiation sensitive mixtures.

Positive working light-sensitive mixtures, i.e., mixtures whose copying layer becomes soluble in the exposed area,, containing the aforementioned constituents are known. In a vast majority of cases, these mixtures contain phenol-formaldehyde condensation products, in particular novolaks, as alkali-soluble binders. Also used for this purpose are copolymers of maleic anhydride and styrene, of vinyl actate and crotonic acid, of alkyl methacrylate, butadiene and methacrylic acid (German Offenlegungsschrift No. 3,107,526) and polymers of vinylphenol (German Offenlegungsschrift No. 3,309,222). These polymers are evidently not preferred, since practically all known commercial products contain novolaks. Nevertheless, novolaks used as binders present disadvantages for certain purposes.

Due to the polyfunctionality of the phenols used, the condensation of phenols or creoles with formaldehyde under acid conditions leads not only to linear but also to highly branched and cyclic products which exert a strong influence on copying properties. The correlation of these properties with synthesis parameters is frequently very difficult or even impossible. This problem area is exhaustively discussed by T.R. Pampalone in *Solid State Technology*, June, 1984, at page 115 *et seq*. According to Pampalone, the material properties of novolaks are limited in variability and adaptability to practical requirements.

For use as binders in dry resist coatings, novolaks are too brittle because of their low molecular weight, so that a novolak-containing layer frequently breaks during processing. Layer breakage can occur, for example, in the course of exposure, when the layer is in contact with a mask, or in the course of lamination, when the layer is applied as a dry resist to a base-material surface. Layer brittleness is particularly noticeable in the case of the higher layer thicknesses preferred for dry resist materials.

Combined with o-quinonediazides, novolaks are used in positive printing plates. To increase the print run, the printing plates are baked, after exposure and development, at temperatures of about 200°–250° C. for a few minutes. In the course of this bake, low molecular weight constituents of the novolak can escape from the layer and deposit on the bared aluminum surface, which upon printing leads to toning, i.e., to undesirable ink acceptance in nonimage areas.

This poor thermal stability of novolaks is also responsible for image distortions in the preparation of integrated circuits by the dry etch method. In this method, temperatures can exceed 150° C., and hence are distinctly higher than the softening point of the novolak. As a consequence, the image structures flow and lead to a lower resolution.

Polyvinylphenol is proposed in German Patentschrift No. 2,322,230 as a novolak replacement in layers that contain o-quinonediazides. Although the plasma resistance and the adhesion to silicon surfaces are basically comparable to novolaks, unexposed photoresist layers based on this polymer are excessively eroded in the course of development. It is true that the degree of erosion decreases with increasing molecular weight, but in the best cases (molecular weight $\simeq$ 25,000) it is still higher than in the case of novolak-based layers by a factor of approximately 100 (according to T.R. Pampalone, *Solid State Technoloov*, June, 1984 at page 119). A further disadvantage is the "peparatively" expensive synthesis and the low polymerization tendency of monomeric vinylphenol.

Japanese Kokai No. 51/36,129 describes the use as binders of polymers based on hydroquinone monomethacrylate and dihydroxynaphthalene monomethacrylate in naphthoquinonediazide layers. The synthesis of these monomers requires an expensive purification step, since the reaction of a diol with an acid chloride gives rise to the diester in a certain percentage, and this diester leads in the subsequent polymerization, even in amounts of 0.5%, to a complete cross-linking and, hence, insolubility of the polymer.

SUMMARY OF THE INVENTION

It is therefore an object of the invention to provide alkali-soluble polymers that have phenolic OH side groups, that do not form brittle layers, that provide good developer and plasma resistance, and that are simple to prepare.

It is also a object of the present invention to provide a radiation-sensitive mixture that can be used in preparing various types of copying layers without the above-summarized drawbacks presented by conventional materials.

It is yet another object of the present invention to provide radiation-sensitive recording material that displays excellent stability in the course of processing, for example, post-exposure baking to increase print-run.

Still another object of the present invention is to provide a process for preparing relief images which does not entail the excessive erosion of unexposed photosensitive surfaces in the course of development.

In accomplishing the foregoing objects, there has been provided, in accordance with one aspect of the present invention, a polymer comprising repeat units represented by formula (I)

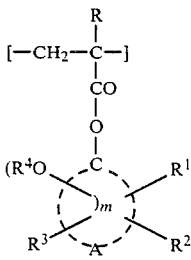

(I)

where
- R is a hydrogen or a halogen atom, a cyanide group or an alkyl group of 1-4 carbon atoms,
- $R^1$, $R^2$ and $R^3$ are identical or different, and each denotes a hydrogen or a halogen atom, an alkyl group, an alkoxy group or an alkoxycarbonyl group,
- $R^4$ is a hydrogen atom or a divalent organic group which is like inter-molecularly or intramolecularly to another unit represented by formula (I), on average at least one $R^4$ of each polymer unit being hydrogen,
- A denotes the atoms required for completing a mononuclear or dincclear carbocyclic or heterocyclic aromatic ring system and
- m is 2 or 3.

There has also been provided, in accordance with another aspect of the present invention, a radiation-sensitive mixture comprising a water-soluble polymeric binder comprised of the above-described polymer, which binder is soluble in aqueous alkaline solutions and has phenolic hydroxyl side groups and
(1) a 1,2-quinonediazide or
(2) a combination of
  (a) a compound which forms a strong acid under the action of actinic radiation and
  (b) a compound which has at least one acid-cleavable C-O-C bond and the solubility of which in a developer is increased by the action of acid.

In accordance with another aspect of the present invention, a radiation-sensitive recording material has been provided that comprises a base material and a radiation-sensitive recording layer provided on the base material, which recording layer is comprised of the radiation-sensitive mixture described in the preceding paragraph.

There has further been provided, in accordance with yet another aspect of the present invention, a process for preparing relief images, comprising the steps of (1) imagewise irradiating a radiation-sensitive recoding material as described above with actinic radiation such that the solubility of the recording layer in an aqueous alkaline developer solution increases and (2) removing irradiated portions of the recording layer by means of an aqueous alkaline developer solution.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

A polymer according to the present invention can be a homopolymer or a copolymer which, in addition to units represented by formula (I), contains other units derived from copolymerizable ethylenically unsaturated monomers. The comonomers are in general monovinyl compounds. They can also contain crosslinkable groups which can be crosslinked catalytically or thermally. The crosslinking can be effected in the course of curing the image stencil after developing, preferably by heating.

When R is an alkyl group in the formula (I), the alkyl group generally contains 1 to 6, preferably 1 or 2, carbon atoms. Particular preference is given to compounds with R = H or methyl.

It is preferable that at least one of the substituents $R^1$, $R^2$ and $R^3$ is a hydrogen atom, and it is particularly preferred that at least two of these substituents are hydrogen atoms. When one or more of $R^1$ through $R^3$ denote a hydrocarbon group, this has preferably 1 to 6, in particular 1 to 3, carbon atoms.

In this regard, a hydrocarbon group is a group selected from branched and unbranched, saturated and unsaturated groups with cyclic and open chains which can be substituted by halogen atoms or hydroxyl groups, or which contain ether or keto groups. Preference is given to unbranched hydrocarbon radicals having 1 to 3 carbon atoms.

When the aromatic ring system A is heterocyclic, it can be, for example, a pyridine, a pyrimidine, a pyrazine, a quinoline, an isoquinoline, a quinoxaline, an indole or a thiophene system. Suitable aromatic rings systems are benzene, naphthalene and biphenyl; particular preference is given to a benzene ring. m is preferably 2.

The position of the $OR^4$ groups is not subject to any restrictions; it depends on the preparative accessibility. In any event, the position of the radicals $R^1$, $R^2$ and $R^3$ depends on the position of the $OR^4$ groups.

When $R^4$ is a divalent group, it is present in the polymer in such an amount as not to impair the solubility of the product. In general, no more than 20 mol-%, preferably no more than 10 mol-%, of the units of formula (I) contain an $R^4O$ group in which $R^4$ is different from H. $R^4$ can in this case be an aromatic or aliphatic group which preferably contains 2 to 15 carbon atoms, and can have been formed, by example, by reacting a diepoxide or diisocyanate with OH groups. The preferred reactants are diisocyanates. Examples of suitbble diisocyanates are tolylene, hexamethylene, 2,2,4-trimethylhexamethylene, lysine, isophorone and diphenylmethane diisocyaaates.

Examples of units of formula (I) that are suitable for use in the present invention are those of monoacrylates or monomethacrylates of pyrogallol, of phloroglucin, of hydroxyhydroquinone, of ethyl 3,4,5-trihydroxybenzoate, of 2,3,4-trihydroxytoluene, of 3,3',4,4'-tetrahydroxy-biphenyl, and of a trihydroxyquinoline. The esters of trihydroxybenzenes, in particular of pyrogallol, are particularly preferred.

The preparation of preferred monomers that form units of formula (I) is described in copending, concurrently-filed U.S. application Ser. No. 896,110, contents of which are hereby incorporated by reference. Other suitable monomers are prepared in a manner analogous to known processes or to the process disclosed in the aforementioned U.S. Pat. application. The latter preparation is effected in trihydroxyaromatics that contain at least two hydroxyl groups in adjacent positions, by converting the hydroxyl groups first, for example, by reacting with phosgene, into the cyclic carbonates; then converting the third hydroxyl group into the ester of an acrylic acid of the formula $CH_2=C(R)-COOH$; and, finally, hydrolyzing the carbonate back again.

The homopolymerization of these monomers, or their copolymerization with other monomers, can be carried out by conventional methods, for example, in the presence of a polymerization initiator such as azobisisobutyronitrile in organic solvents such as butanone or ethanol at elevated temperatures over 1 to 20 hours. But, it is also possible to effect a suspension, emulsion or mass polymerization which can be initiated by radiation, heat or ionic initiators.

The polymers containing units of formula (I) can be homopolymers that have only structural units of formula (I), or can be copolymers comprised of monomers conforming to formula (I) and one or more other vinyl monomers, including, where appropriate, those having phenolic groups. It is also possible to copolymerize different monomers conforming to formula (I), such as pyrogallol acrylate and pyrogallol methacrylate, with one another and also, where appropriate, with other vinyl monomers.

The molecular weight of the homopolymers and copolymers can be varied within wide limits; preference is given to polymers with $\overline{MHD}$ n=1000-200,000, in particular those with $\overline{MHD}$ n=5000-100,000. The hydroxyl number is in general within the range from 100 to about 450, preferably between 200 and 350.

The choice of suitable homopolymers and copolymers depends in any given case on the intended purpose and on the nature of the other components in the radiation- or light-sensitive mixture. For instance, the hydrophilic character of the binder of a light-sensitive mixture is of importance for the light sensitivity, developing time and developer resistance. The hydrophilic character must therefore be adapted to the particular light-sensitive system. Systems with oquinonddiazides require a more hydrophilic binder than systems with acid-cleavable orthoester or acetal groupings.

The application properties of a light-sensitive mixture are further governed by its softening temperature, which is essentially determined by that of the binder. In the case of printing plates, or in the case of microresists for the manufacture of integrated circuits, a high softening temperature is required in order to avoid the disadvantages first mentioned, such as toning and image distortion. By contrast, usage as a dry resist requires a system having lower softening points in order to make possible dry layer transfer by means of pressure and heat.

The mixture according to the invention makes it possible to vary the above-mentioned properties in a controlled manner and to tailer them to particular operating requirements. This can be done, for example, by
  varying the radicals R, $R^1$, $R^2$, $R^3$ and $R^4$
  varying the number of phenolic groups
  varying the ratio of the units of formula (I)
  varying the ratio and the nature of additional comonomers. The following examples illustrate these possibilities.

Preferred comonomers for the compounds that polymerize to give units of formula (I) are compounds represented by the formula

where
  $R^5$ is a hydrogen or a halogen atom or an alkyl group,
  $R^6$ is an alkyl, alkoxy, alkyloxycarbonyl, acyl, acyloxy, aryl, formyl, cyanide, carboxyl, hydroxyl or aminocarbonyl group and
  $R^7$ is a hydrogen atom or a carboxyl group which can be bonded to $R^6$, when the latter is a carboxyl group, to form an acid anhydride.

When $R^5$ or $R^6$ are alkyl groups, they generally have 1-4 carbon atoms; suitable representatives of $R^6$ are alkoxy groups having 1-8 carbon atoms, alkyloxycarbnyl groups having 2-13 carbon atoms, acyl groups having 2-9 carbon atoms and acyloxy groups having 2-5 carbon atoms. The aminocarbonyl groups can be unsubttituted or be substituted by one or two alkyl groups having 1-8 carbon atoms, where the term "alkyl groups" has the above-mentioned meaning. Examles of such compounds are styrene, α-chlrostyrene, α-methylstyrene, 2-, 3or 4-chloromethylstyrene, 4-bromostyrene, methyl vinyl ether, ethyl vinyl eher, propyl vinyl ether, butyl vinyl ether, acrylonitrile, acrolein, butadiene, acrylic aiid, methacrylic acid, the methyl, ethyl, propyl, butyl, pentyl, hexyl, decyl, dodecyl, 2-ethylhexyl, phenyl, benzyl, biphenylyl and naphthyl esters of these acids, methacrylamide, acrylamide, vinyl acetate, vinyl isobutyl ketone and maleic anhydride.

The content of units of formula (I) in a copolymer of the present invention depends on the other components of the mixture and the use intended for the mixture. In general, polymers used in the mixture according to the present invention contain 20 to 100 mol-%, preferably 40 to 100 mol-% of formula (I) units.

To prepare the mixtures according to the present invention, the binder described above is combined with radiation-sensitive compounds or mixtures whose solubility in an aqueous alkaline developer solution is increased on exposure to light or high-energy radiation. These include, in particular, o-quinonediazides and combinations of photolytic acid donors with acid-cleavable compounds. The o-quinonediazides used in the present invention are preferably 1,2-naphtho-quinone-2-diazide-4- or -5-sulfonic acid esters or amides. Of these, the esters, in particular those of the 5-sulfonic acids, are preferred. Suitable compounds of this type are known and described, for example, in German Patent No. 938,233 and in German Offenlegungsschriften No. 2,131,377, No. 2,547,905 and No. 2,828,017.

The amount of o-quinonediazide compounds is in general 3 to 50% by weight, preferably 7 to 35% by weight, based on the nonvolatile portions of the mixture. The amount of binder is in general 30 to 90% by weight, preferably 55 to 85% by weight, computed on the same basis.

Further suitable constituents for use in the present invention are, for example, plasticizers, dyes, indicators, pigments, sensitizers and levelling agents.

Materials based on acid-cleavable compounds can also be used very successfully in a mixture according to the present invention. Representatives of suitable acid-cleavable compounds are primarily:

(a) those with at least one orthocarboxylic acid ester and/or carboxylic acid amide acetal grouping, it being possible for the compounds also to have polymeric character and for the groupings mentioned to appear as linking elements in the main chain or as lateral substituents, (b) oligomer or polymer compounds having recurring acetal and/or ketal groupings in the main chain, and (c) compounds having at least one enolic ether or N-acyl-iminocarbonate grouping.

Acid-cleavable compounds of type (a) are components of radiation-sensitive mixtures described in detail in European patent application No. 0 022 571; mixtures that contain compounds of tape (b) are described in German Patentschriften No. 2,306,248 and No. 2,718,254; and compounds of type (c) are described in European applications No. 0 006 626 and No. 0 006 627.

The nature and amount of binder and of cleavable compound, respectively, can vary according to the intended use; preference is given to binder contents between 30 and 90% by weight, in particular 55 to 85% by weight. The amount of cleavable compound can be varied between 5 and 70% by weight, preference being given to the range from 5 to 40% by weight.

It is also possible to include many other oligomers and polymers, such as phenolic resins of the novalak type and vinyl polymers, for example, polyvinyl acetals, polymethacrylates, polyacrylates, polyvinyl ethers and polyvinylpyrrolidones, which can themselves have been modified by comonomers. The most favorable amount of these additives depends on the application requirements and on their effect on developing conditions; in general, the amount is no more than 40% of the polymer of units of formula (I). For specific requirements such as flexibility, adhesion, gloss and the like, the light-sensitive layer can additionally contain, in small amounts, substances such as polyglycols, cellulose ether (for example, ethyl cellulose), wetting agents, levelling agents, dyes and finely-divided pigments.

Suitable radiation-sensitive components that on irradiation preferably form or eliminate strong acids comprise a large group of known compounds and mixtures, such as diazonium, phosphonium, sulfonium and iodonium salts; halogen compounds; o-quinonediazidesulfochlorides and organometal-organohalogen combinations. The aforementioned diazonium, phosphonium, sulfonium and iodonium compounds are generally used in the form of their salts which are soluble in organic solvents, usually as deposition products with couple acids such as hydroborofluoric acid, hexafluorophosphoric, hexafluoroantimonic and hexafluoroarsenic acid.

In principle, the halogen-containing, radiation-sensitive compounds that form halohydric acid can be any organic halogen compound also known as a photochemical free-radical initiator, for example, those compounds having more than one halogen atom on a carbon atom or on an aromatic ring. Examples are described in U.S. Pat. Nos. 3,515,552, 3,536,489 and 3,779,778, in German Patentschrift No. 2,610,842 and in German Offenlegungsschriften Nos. 2,243,621, 2,718,259 and 3,337,024. Of these compounds, preference is given to the s-triazine derivatives with two halogenomethyl groups, especially trichloromethyl groups, and an aromatic or unsaturated substituent in the triazine nucleus, which compounds are described in German Offenlegungsschriften Nos. 2,718,259 and 3,337,024. The action of these halogen-containing compounds can also be spectrally affected and enhanced by known sensitizers.

Examples of suitable initiators are: 4-(di-n-propylamino)-benzenediazonium tetrafluoroborate, 4-ptolylmercapto-2,5-diethoxybenzenediazonium hexafluorophosphate and tetrafluoroborate, diphenylaiine-4-diazonium sulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethylquinoline, 2,4-dimethyl-1-tribromoacetylbenzene, 3-nitro-1-tribromoacetylbenzene, 4-dibromoacetylbenzoic acid, 1,4-bis-dibromomethylbenzene, tris-dibromomethyls-triazine, 2-(6-methoxynaphth-2- yl)-, 2-(naphth-1yl)-, 2-(naphth-2-yl)-, 2-(4-ethoxy-ethylnaphth-1-yl)-, 2-benzopyran-3-yl)-, 2-(4-methoxyantrac-1-yl-, 2-(4-styrylphenyl)-, 2-phenanthr-9-yl)-4,6-bis-trichloro-methyl-s-triazine, and the compounds listed in the following examples.

The amount of initiator can likewise vary very widely according to its chemical nature and the composition bf the mixture. Favorable results are obtained with about 0.1 to 10% by weight, preferably 0.2 to 5% by weight, based on the total solids. Particularly for copying layers over 10 μm in thickness, it is advisable to use relatively less acid donor.

Finally, the light-sensitive mixture can also contain soluble or even finely-divided, dispersible dyes and, depending on the intended use, UV absorbers. Suitable dyes include the triphenylmethane dyes, especially in the form of their carbinol bases. The most favorable mixing ratios of the components can easily be determined in the individual case by means of preliminary experiments.

Suitable base materials for the light-sensitive mixtures are all materials customarily used in the art in copying processes. Examples which may be mentioned are plastic films, insulating sheaths with copper layer, mechanically or electrochemically roughened and optionally anodized aluminum, screen printing stencil supports, wood, ceramics, glass, and silicon with a surface which can have been chemically converted, for example, into silicon nitride or silicon dioxide.

Preferred base materials for thick layers over 10 μm are plastic films, which then serve as temporary base materials for transfer layers. For this purpose and for color films, preference is given to polyester films, such as polyethylene terephthalate. Polyolefin films like polypropylene are also suitable, however. The base materials used for layer thicknesses below about 10 μm are usually metals. In the case of offset printing plates it is possible to use mechanically or chemically roughened and optionally anodized aluminum which can, in addition, have been chemically pretreated, for example, with polyvinylphosphonic acid, silicates or phosphates.

Finally, coating can be effected directly or by layer transfer from temporary base materials onto circuit board materials that comprise insulating boards with a copper layer on one or both sides, onto glass or ceramic materials that may have been given a tackifying pre-treatment, and onto silicon wafers. It is also possible to coat wood, textiles and surfaces of many materials that are advantageously imaged by projection and resistant to the action of alkaline developers.

For the drying after coating, it is possible to adopt the customary equipment and conditions, temperatures around 100° C. and briefly up to 120° C. being withstood without loss of radiation seniitivity.

Exposure can be effected with the customary light sources such as fluorescent lamps; xenon pulsed lamps; metal halide doped mercury vapor high-pressure lamps; and carbonarc lamps. For the purposes of this description, "irradiation" pertains to the action of actinic electromagnetic radiation in the wavelength region below about 500 nm. All the radiation sources that emit in this wavelength region are suitable for use with the present invention.

It is advantageous to use laser irradiators, in particular automatic processing systems, which contain as the source of radiation an argon ion laser. Irradiation can also be effected with electron beams. In this case it is also possible to use compounds which, in the customary sense, do not form light-sensitive acid as initiators of the solubilizing reaction; for example, halogenated aromatic compounds or halogenated polymeric hydrcarbons are suitable in this regard. X- or ion rays can likewise be used for image generation.

The imagewise exposed or irradiated layer can be removed in a conventional manner with the developers known for use with commercially available naphthoquinonediazide layers and photoresists. The copying behavior of the new materials of the present invention can be adapted advantageously to the known auxiliaries, such as developers and programmed spray development apparatus. The aqueous developer solutions can contain, for example, alkali metal phosphates, silicates and hydroxides, and also wetting agents as well as, if desired, minor amounts of organic solvents. In certain cases even solvent-water mixtures are usable as a developer. The choice of the most favorable developer can be determined by experiments on the particular layer used. If necessary, the development can also be aided mechanically.

In the case of using a compound of the present invention to prepare printing plates, the developed plates can be briefly heated to elevated temperatures to increase the durability in printing and the resistance to washing-out agents, correcting agents and UV-curable printing inks, as known for diazo layers from British patent specification No. 1,154,749.

The present invention also provides a process for preparing relief images by imagewise irradiating a radiation-sensitive recording material comprised of a base material and a recording layer as described above, which process comprises exposing the layer to actinic radiation in such an amount that the solubility of the layer increases in an aqueous alkaline developer solution. The irradiated parts of the layer, which contains as binder a polymer comprising units of formula (I), are then removed by means of an aqueous alkaline developer solution.

The present invention makes possible the obtaining of positive layers whose properties are adjustable in a controlled manner according to the application requirements. Through suitable choice of the binders of the present invention, it is possible, or example, to obtain thin, positive layers which have excellent adhesion to the substrate and outstanding temperature, etch and abrasion stability.

On the other hand, the binders of the present invention can also be used to obtain positive layers for use in higher layer thicknesses of about 15 μm to 100 μm or more, for example, as dry resists. These dry films have a high light sensitivity and an excellent flexibility, and can be satisfactorily processed from the roll.

General Method for Preparing Polymers with the Present Invention

In a four-necked flask with stirrer, reflux condenser, internal thermometer and dropping funnel, 40 pbv of ethanol were heated to boiling in the absence of oxygen. In the course of 3 hours at gentle reflux, a mixture of 40 pbw of the monomer(s), dissolved in 60 pbw of ethanol, and 0.4 pbw of azobisisobutyronitrile were added dropwise. This was followed by 12 hours of reaction, and after cooling down and optional dilution with ethanol, the solution was added dropwise to about 10,000 pbv of water with vigorous stirring. The precipitated, colorless polymer as filtered off with suction, washed and dried at 50° C. in vacuo for 48 hours.

Table 1 summarizes the polymers prepared in this way.

TABLE 1

$$[CH_2-\underset{\underset{\underset{O}{|}}{\underset{C=O}{|}}}{\overset{R}{\underset{|}{C}}}]_a \text{ and } [-B-]_b$$

$$R^1-\bigcirc-(OH)_m$$

Polymers prepared from units of the types

| No. of polymer | R | m | Position OH | R¹ | Position R¹ | B | a:b (mol-%) |
|---|---|---|---|---|---|---|---|
| 1 | H | 2 | 2.3 | H | — | — | — |
| 2 | CH₃ | 2 | 2.3 | H | — | — | — |
| 3 | H | 2 | 2.3 | COOC₂H₅ | 5 | — | — |
| 4 | CH₃ | 2 | 2.3 | COOC₂H₅ | 5 | — | — |
| 5 | H | 2 | 2.3 | H | — | MMA | 30:70 |
| 6 | H | 2 | 2.3 | H | — | " | 40:60 |
| 7 | H | 2 | 2.3 | H | — | " | 50:50 |
| 8 | CH₃ | 2 | 2.3 | H | — | EHMA | 60:40 |
| 9 | CH₃ | 2 | 2.3 | H | — | " | 65:35 |
| 10 | CH₃ | 2 | 2.3 | H | — | " | 70:30 |
| 11 | CH₃ | 2 | 2.3 | H | — | " | 85:15 |
| 12 | CH₃ | 2 | 2.3 | H | — | BMA | 50:50 |
| 13 | CH₃ | 2 | 2.3 | H | — | " | 80:20 |
| 14 | CH₃ | 2 | 2.3 | H | — | " | 90:10 |
| 15 | CH₃ | 2 | 2.3 | COOC₂H₅ | 5 | HMA | 60:40 |
| 16 | CH₃ | 2 | 3.4 | H | — | HMA | 60:40 |
| 17 | CH₃ | 2 | 3.4 | H | — | " | 70:30 |
| 18 | CH₃ | 2 | 3.4 | H | — | BMA | 80:20 |
| 19 | CH₃ | 2 | 3.5 | H | — | EHMA | 60:40 |
| 20 | CH₃ | 2 | 3.5 | H | — | S | 70:30 |
| 21 | CH₃ | 2 | 2.6 | H | — | — | — |
| 22 | CH₃ | 2 | 2.6 | H | — | HMA | 75:25 |
| 23 | CH₃ | 3 | 3,4,5 | H | — | BuMa | 60:40 |
| 24 | CH₃ | 3 | 3,4,5 | H | — | BMA | 65:35 |
| 25 | CH₃ | 3 | 3,4,6 | H | — | HMA | 70:30 |
| 26 | CH₃ | 3 | 3,4,6 | H | — | — | — |

BMA Biphenylyl 4-methacrylate
BuMA n-Butyl methacrylate
EHMA 2-Ethylhexyl methacrylate
HMA n-Hexylmethacrylate
MMA Methyl methacrylate
S Styrene The polymers described in Table 1 can be processed into reproduction layers in admixture with light-sensitive systems. The examples below show the versatile application possibilities of these binders in mixtures according to the present invention. Percentages and weights are by weight unless otherwise stated. Parts by weight (pbw) relate to parts by volume (pbv) as the g relates to the ml.

The following coating solutions are prepared for various application possibilities:

| | Coating solution A: |
|---|---|
| 8 pbw | of binder, |
| 1 pbw | of esterification product of 1 mole of 2,3,4-trihydroxybenzophenone and 3 mole of 1,2-naphthoquinone-2-diazide-5-sulfonyl chloride and |
| 0.01 pbw | crystal violet base in |
| 80 pbw | 1-methoxy-2-propanol and |
| 20 pbw | butyl acetate. |
| | Coating solution B: |
| 40 pbw | of binder, |
| 10 pbw | of polyacetal of triethylene glycol and butyraldehyde, |
| 0.5 pbw | of 2-(4-ethoxynaphth-1-yl)-4,6-bis-trichloromethyl-s-triazine and |
| 0.05 pbw | of crystal violet base in |
| 110 pbw | butanone. |
| | Coating solution C: |
| 40 pbw | of binder, |
| 8 pbw | of a polymeric orthoester prepared by condensing trimethyl orthoformate with 4-oxa-6,6-bis-hydroxymethyl-octan-1-ol, |
| 0.5 pbw | of 2-(4-styrylphenyl)-4,6-bis-trichloromethyl-s-triazine and |
| 0.05 pbw | of crystal violet base in |
| 80 pbw | butanone and |
| 20 pbw | of ethanol. |
| | Coating solution D: |
| 26.5 pbw | of binder, and |
| 3.5 pbw | of the naphthoquinonediazide used in coating solution A in |
| 70 pbw | of a solvent mixture of 1-methoxy-propanol-2, butylacetate and xylene (8:1:1). |
| | Coating solution E: |
| 20 pbw | of binder, |
| 6.5 pbw | of cresol-formaldehyde-novolak with a softening range of 105-120° C. and |
| 3.5 pbw | of the naphthoquinonediazide of coating solution A in |
| 70 pbw | of a solvent mixture of 1-methoxy-propanol-2, butylacetate and xylene (8:1:1). |
| | Coating solution F: |
| 10 pbw | of binder, |
| 3 pbw | of the bis-(5-butyl-5-ethyl-1,3-dioxan-2-yl) ether of 2-butyl-2-ethylpropanediol and |
| 0.25 pbw | of 2-(Acenaphth-5-yl)-4,6-bis-trichloromethyl-s-triazine in |
| 90 pbw | of butanone. |

EXAMPLES 1 to 16

To prepare offset printing plates, binders of Table 1 were mixed with the components specified in Table 2 - according to the directions concerning coating solutions A, E and F (see Table 2).

TABLE 2

| Example No. | Polymer No. | Coating solution | Exposure time (s) | Developing time (s) |
|---|---|---|---|---|
| 1 | 1 | E | 100 | 60 |
| 2 | 2 | E | 100 | 60 |
| 3 | 3 | E | 100 | 70 |
| 4 | 4 | E | 100 | 80 |
| 5 | 9 | F | 20 | 40 |
| 6 | 11 | A | 100 | 55 |
| 7 | 13 | F | 20 | 40 |
| 8 | 14 | A | 100 | 50 |
| 9 | 15 | E | 100 | 60 |
| 10 | 17 | A | 100 | 80 |

TABLE 2-continued

| Example No. | Polymer No. | Coating solution | Exposure time (s) | Developing time (s) |
|---|---|---|---|---|
| 11 | 18 | F | 20 | 70 |
| 12 | 20 | F | 20 | 70 |
| 13 | 21 | E | 100 | 90 |
| 14 | 22 | F | 20 | 40 |
| 15 | 24 | F | 40 | 70 |
| 16 | 25 | A | 100 | 60 |

These solutions were whirler-coated onto electrolytically roughened and anodized aluminum plates which had been treated beforehand with an aqueous solution of polyvinylphosphonic acid. By adjusting the speed of rotation of the whirler, the layer thickness (dry) was brought to about 1.5 μm for all plates. The plates were then dried at 100° C. in a through-circulation cabinet for 10 minutes.

After exposure under a 5 kW metal halide lamp at a distance of 110 cm, and after a waiting time of 10 minutes for the layers prepared with coating solution F, the plates were developed in a solution of 5.3 pbw of sodium metal silicate x 9 $H_2O$
3.4 pbw of trisodium phosphaee x 12 $H_2O$ and
0.3 pbw of sodium dihydrogenphosphate (anhydrous) in
91.0 pbw water.

The portions of the copying layer which had been struck by the light were thereby removed, leaving the unexposed image areas on the plate.

Table 2 shows the binders and the coating solutions used in each case, and the exposure and developing times for the individual layers. After inking with oleophilic printing ink, the printing forms thus prepared can be used to prepare 100,000 satisfactory prints in an offset printing machine.

EXAMPLES 17 to 25

To prepare a positive dry resist, binders of Table 1 were mixed with the other components in accordance with the directions concerning coating solutions B and C (see Table 3). These solutions were in each case whirler-coated onto 26 μm-thick, biaxially drawn and heat-set polyethylene terephthalate films, and then were dried at 110° C. in the through circulation cabinet for 10 minutes. The speed of the whirler was regulated to provide a layer thickness of about 25 μm. As protection against dust and scratching, a polyethylene film was additionally laminated on top.

For comparison, a dry resist was prepared with exclusively cresol-formaldehyde novolak as binder (Example 25).

The dry resists with the binders according to the present invention exhibited a distinctly improved flexibility compared with the dry resist comprising a novolak binder. While the novolak-containing resist easily tore in the course of lamination or in the course of folding, these disadvantages did not arise with the dry resists prepared using the new binders.

To prepare circuit boards, the dry resists, after the cover film had been pulled off, were laminated in a commercially available laminator onto a cleaned, preheated base which comprised an insulating board with a 35 μm-thick copper layer. Removal of the base film and optional subsequent drying were followed by exposure under a master to a 5 kW metal halide lamp at a distance of 110 cm and, after a waiting time of 10 minutes, by development in the developer specified in the Examples 1 to 16.

The resist stencils obtained in this way displayed excellent electroplating resistance, in particular as to electroplating buildup of copper and Pb/Sn alloys.

Boards treated in this way can subsequently be subjected to renewed exposure and development. By this procedure it is possible, in a first step, to electroplate Pb/Sn solder pads at the drilled holes; in a second exposure and developing step, the conducting-path image can then be transferred to the still light-sensitive resist stencil. Etching of the bared copper with ammoniacal Cu(II) chloride solution gives a circuit board embodying copper technology, i.e., the Pb/Sn alloy is built up only where it is required in the subsequent soldering process.

TABLE 3

| Example No. | Polymer No. | Coating solution | Exposure time (s) | Developing time (s) |
| --- | --- | --- | --- | --- |
| 17 | 7 | B | 20 | 50 |
| 18 | 9 | C | 20 | 40 |
| 19 | 10 | B | 20 | 90 |
| 20 | 15 | B | 20 | 45 |
| 21 | 19 | B | 10 | 50 |
| 22 | 22 | C | 10 | 50 |
| 23 | 23 | C | 10 | 30 |
| 24 | 25 | B | 50 | 30 |
| 25 (C) | cresol-Novolak | B | 30 | 60 |

EXAMPLES 26 to 37

To prepare microelectronic circuit elements of high integration, binders listed in Table 1 were mixed with the other components in accordance with the directions concerning coating solutions D, E and F (see Table 4). After filtration through a (millipore) filter having a pore diameter of 0.2 μm, the photoresist solutions were whirler-coated onto commercial silicon wafers which had been provided with an 0.2 μm-thick $SiO_2$ layer by oxidation.

By varying the speed of rotation, the layer thicknesses were adjusted to between about 0.9 μm and 1.2 μm.

The wafers thus coated were dried at 90° C. for 30 minutes. After cooling down an conditioning in the defined atmosphere of 23° C. and 40-50% relative humidity, the wafers were exposed under a commercially available chromium mask in a contact exposure apparatus.

The exposure times were about 1 second for the layers prepared with coating solutions B and C and about 3 seconds for the layers prepared with coating solutions D and E. A waiting time of 10 minutes in the case of Examples 30, 33, 34 and 36 was followed by development in the developer specified in Examples 1 to 16.

In all cases it was possible to obtain satisfactory resolution of image elements in the region of 1 μm.

TABLE 4

| Example No. | Polymer No. | Coating solution | Developing time (s) |
| --- | --- | --- | --- |
| 26 | 1 | E | 70 |
| 27 | 2 | E | 120 |
| 28 | 3 | E | 70 |
| 29 | 12 | E | 40 |
| 30 | 13 | F | 30 |
| 31 | 14 | D | 70 |
| 32 | 18 | E | 60 |
| 33 | 18 | F | 40 |

TABLE 4-continued

| Example No. | Polymer No. | Coating solution | Developing time (s) |
| --- | --- | --- | --- |
| 34 | 20 | F | 50 |
| 35 | 21 | E | 70 |
| 36 | 24 | F | 60 |
| 37 | 26 | D | 30 |

What is claimed is:

1. A polymer comprising repeat units X, wherein X is represented by the formula

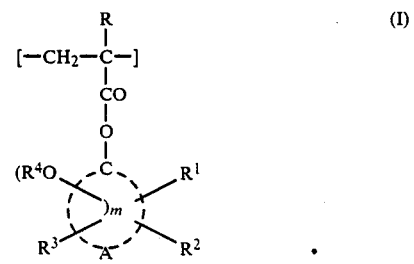

where
R is a hydrogen or a halogen atom, a cyanide group or an aliphatic hydrocarbon group of 1–4 carbon atoms,
$R^1$, $R^2$, $R^3$ are identical or different, and each denotes a hydrogen or a halogen atom, an alkoxycarbonyl group, or a hydrocarbon group selected from branched and unbranched, saturated and unsaturated groups with cyclic and open chains which can be substituted by halogen atoms or hydroxyl groups, or which contain ether or keto groups,
$R^4$ is a hydrogen atom or a divalent organic group which is linked intermolecularly or intramolecularly to another unit represented by formula (I), on average at least one $R^4$ of each polymer unit being hydrogen,
A denotes the atoms required for completing a mononuclear or dinuclear carbocyclic or heterocyclic aromatic ring system and
m is 2 or 3,
and said polymer being a homopolymer of units X or a copolymer of units X and units Y, wherein Y is represented by the formula

where
$R^5$ is H, alkyl or alkenyl,
$R^6$ is alkyl, carboxyl, alkoxycarbonyl or alkylcarbonyloxy, and
$R^7$ is H or carboxyl, or $R^6$ and $R^7$ together are an acid anhydride group.

2. The polymer as claimed in claim 1, wherein A denotes the carbon atoms required for completing a benzene ring.

3. The polymer as claimed in claim 1, wherein said polymer has a molecular weight $\overline{MHD}$ n of between about 1000 to 200,000.

4. The polymer as claimed in claim 1, wherein m is 2.

5. The polymer as claimed in claim 1, wherein said polymer comprises 20 to 100 mol-% of units of formula (I).

6. A radiation-sensitive mixture comprising:
(A) a water-insoluble polymeric binder which is soluble in aqueous alkaline solutions and has phenolic hydroxyl side groups and
(B)
(1) a 1,2-quinonediazide or
(2) a combination of
(a) a compound which forms a strong acid under the action of actinic radiation and
(b) a compound which has at least one acid cleavable C-O-C bond and the solubility of which in a developer is increased by the action of acid,
wherein said binder comprises a polymer comprised of repeat units X, wherein X is represented by the formula

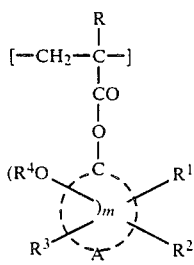

where
R is a hydrogen or a halogen atom, a cyanide group or an aliphatic hydrocarbon group of 1–4 carbon atoms,
$R^1, R^2, R^3$ are identical or different, and each denotes a hydrogen or a halogen atom, an alkoxycarbonyl group, or a hydrocarbon group selected from branched and unbranched, saturated and unsaturated groups with cyclic and open chains which can be substituted by halogen atoms or hydroxy groups, or which contain ether or keto groups,
$R^4$ is a hydrogen atom o a divalent organic group which is linked inter-molecularly or intramolecularly to another unit represented by formula (I), on average at least one $R^4$ of each polymer unit being hydrogen,
A denotes the atoms required for completing a monomuclear or dinuclear carbocyclic or heterocyclic aromatic ring system and
m is 2 or 3,
and said polymer being a homopolymer of units X or a copolymer of units X add units Y, wherein Y is represented by the formula

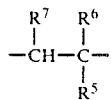

where
$R^5$ is H, alkyl or alkenyl,
$R^6$ is alkyl, carboxyl, alkoxycarbonyl or alkylcarbonyloxy, and
$R^7$ is H or carboxy,,
or $R^6$ and $R^7$ together are an acid anhydride group.

7. A radiation-sensitive recording material comprising a base material and a radiation-sensitive recording layer provided on said base material, said recording layer comprising (A) a water-insoluble polymeric binder which is soluble in aqueous alkaline solutions and has phenolic hydroxyl side groups and
(B)
(1) a 1,2-quinonediazide or
(2) a combination of
(a) a compound which forms a strong acid under the action of actinic radiation and
(b) a compound which has at least one acid cleavable C-O-C bond and the solubility of which in a developer is increased by the action of acid,
wherein said binder comprises a polymer comprising repeat units X, wherein X is represented by the formula

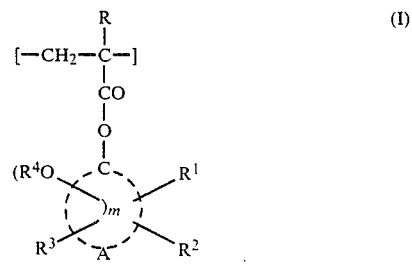

where
R is a hydrogen or a halogen atom, a cyanide group of an aliphatic hydrocarbon group of 1–4 carbon atoms,
$R^1, R^2, R^3$ are identical or different, and each denotes a hydrogen or a halogen atom, an alkoxycarbonyl group, or a hydrocarbon group selected from branched and unbranched, saturated and unsaturated groups with cyclic and open chains which can be substituted by halogen atoms or hydroxyl groups, or which contain ether or keto groups,
$R^4$ is a hydrogen atom or a divalent organic group which is linked intermolecularly or intramoleularly to another unit represented by formula (I), on average at least one $R^4$ of each polymer unit being hydrogen,
A denotes the atoms required for completing a mononuclear or dinuclear carbocyclic or heterocyclic aromatic ring system and
m is 2 or 3,
and said polymer being a homopolymer of units X or a copolymer of units X and units Y, wherein Y is represented by the formula

where
$R^5$ is H, alkyl or alkenyl,
$R^6$ is alkyl, carboxyl, alkoxycarbonyl or alkylcarbonylosy, and
$R^7$ is H or carbonyl,
or $R^6$ and $R^7$ together are an acid anhydride group.

8. A process for preparing relief images, comprising the steps of (1) imagewise irradiating a radiation-sensitive recording material as claimed in claim 7 with actinic radiation such that the solubility of the recording layer in an aqueous alkaline developer solution increases and (2) removing irradiated portions of the recording layer by means of an aquious alkaline developer solution.

UNITED STATES PATENT AND TRADEMARK OFFICE
CERTIFICATE OF CORRECTION

PATENT NO. : 4,910,119

DATED : March 20, 1990

INVENTOR(S) : Arnold Schneller, Juergen Sander

It is certified that error appears in the above—identified patent and that said Letters Patent is hereby corrected as shown below:

Col. 5, lines 30 and 31, "MHD n" should read "$M_n$".

Col. 14, line 66, "MHD n" should read "$M_n$".

Col. 15, line 42, "o" should read "or".

Col. 15, line 43, "inter-molecularly" should read "intermolecularly".

Col. 15, line 47, "monomuclear" should read "mononuclear".

Col. 15, line 51, "add" should read "and".

Col. 15, line 64, "carboxy" should read "carboxyl".

Col. 16, line 38, "intramoleurlarly" should read "intramolecularly".

Col. 16, line 57, "bonylosy" should read "bonyloxy".

Col. 16, line 66, "aquious" should read "aqueous".

Signed and Sealed this

Seventeenth Day of March, 1992

Attest:

HARRY F. MANBECK, JR.

Attesting Officer   Commissioner of Patents and Trademarks